United States Patent [19]

Kanterakis

[11] Patent Number: 5,640,425
[45] Date of Patent: Jun. 17, 1997

[54] FAST-ACTING COSTAS LOOP

[75] Inventor: Emmanuel Kanterakis, North Brunswick, N.J.

[73] Assignee: Golden Bridge Technology, Inc., West Long Branch, N.J.

[21] Appl. No.: 578,422

[22] Filed: Dec. 26, 1995

[51] Int. Cl.[6] .................. H04L 27/14; H04L 27/16; H04L 27/22
[52] U.S. Cl. .................. 375/326; 375/329; 329/308
[58] Field of Search .................. 375/200, 206–208, 375/350, 344, 362, 364, 345, 326, 327, 329; 329/307, 308, 309; 331/1 R

[56] References Cited

U.S. PATENT DOCUMENTS

| | | | |
|---|---|---|---|
| 4,112,372 | 9/1978 | Holmes et al. | 325/321 |
| 4,164,628 | 8/1979 | Ward et al. | 179/15 |
| 4,279,018 | 7/1981 | Carson | 364/514 |
| 4,285,060 | 8/1981 | Cobb et al. | 375/200 |
| 4,320,531 | 3/1982 | Dimon | 455/203 |
| 4,336,616 | 6/1982 | Carson et al. | 455/202 |
| 4,392,232 | 7/1983 | Andren et al. | 375/86 |
| 4,538,280 | 8/1985 | Mosely, Jr. et al. | 375/200 |
| 4,559,499 | 12/1985 | Bursztejn et al. | 329/50 |
| 4,621,365 | 11/1986 | Chiu | 375/200 |
| 4,630,283 | 12/1986 | Schiff | 375/200 |
| 4,649,549 | 3/1987 | Halpern et al. | 380/32 |
| 4,653,069 | 3/1987 | Roeder | 380/31 |
| 4,672,629 | 6/1987 | Beier | 375/200 |
| 4,687,999 | 8/1987 | Desperben et al. | 375/261 |
| 4,730,340 | 3/1988 | Frazier, Jr. | 375/200 |
| 4,841,545 | 6/1989 | Endo et al. | 375/200 |
| 4,860,307 | 8/1989 | Nakayama | 375/200 |
| 4,912,722 | 3/1990 | Carlin | 375/200 |
| 5,214,390 | 5/1993 | Montreuil | 329/309 |

*Primary Examiner*—Tesfaldet Bocure
*Assistant Examiner*—Bryan Webster
*Attorney, Agent, or Firm*—David Newman & Associates, P.C.

[57] ABSTRACT

A system and method using a Costas loop to effect accelerated convergence with minimal system complexity. The system comprises an in-phase-limiter and a quadrature-phase limiter, operatively coupled to an EXCLUSIVE-OR gate, for exclusively-ORing an in-phase-sign signal and a quadrature-phase-sign signal to output a first error signal, responsive to the signals having same signs, or a second error signal, responsive to the signals having different signs. An AGC circuit, operatively coupled to an output of the EXCLUSIVE-OR gate, increases and decreases a voltage level of an AGC signal responsive to two consecutive first or second error signals and consecutive dissimilar error signals, respectively. A voltage-controlled oscillator, operatively coupled to an output of the AGC circuit and responsive to the increased or decreased voltage level, changes the frequency of a voltage-controlled-oscillator output signal.

10 Claims, 6 Drawing Sheets

FAST-ACTING COSTAS LOOP

BACKGROUND OF THE INVENTION

This invention relates to Costas loops, and more particularly to an improvement to the Costas loop which increases the rate of tracking a frequency.

DESCRIPTION OF THE RELEVANT ART

In consumer products the cost must be minimized. For radio transmitter and receiver applications, crystals, and not frequency synthesizers, typically are used. Crystals are cut to thirty parts per million (PPM) to reduce cost, rather than one or five parts per million as found in a military type system. Hence, at 2000 MHz, for example, the frequencies between a transmitter and a receiver may differ by 60 kHz. In a cordless phone application, if a handset were taken into extreme hot or cold temperatures it may not be possible to compensate for the frequency deviation, unless a Costas loop is used. The frequency controlling element in that loop is a crystal.

Current designs of Costas loops are implemented using different configurations of the arm filters and various orders for the loop or lowpass filter. Thresholding of the in-phase arm is often followed by a sign change, using a data-aided feedback configuration, aimed at simplifying the hardware and increasing the acquisition speed. The loop filter has often remained as a second order filter which occasionally switches to a third order filter after the Costas loop has been locked. These types of structures are typically complex and very slow in convergence, especially for large frequency offsets. It is a purpose of this invention to accelerate the convergence while keeping the overall system complexity and associated cost to a minimum. A Costas loop as defined here as a type of phase locked loop which controls a voltage controlled oscillator, can closely follow the phase of the incoming signal. However, this invention applies to both frequency locked loops and/or phase locked loops which are closed-loop, feedback systems.

SUMMARY OF THE INVENTION

A general object of the invention is to decrease cost and reduce the frequency acquisition time of a Costas loop.

Another object of the invention is a fast Costas loop which can operate in conditions of extreme heat and cold.

An additional object of the invention is an improved Costas loop which can increase the rate of acquisition, depending on received signals.

According to the present invention, as embodied and broadly described herein, an improvement to a Costas loop includes an in-phase limiter, a quadrature-phase limiter, an EXCLUSIVE-OR (XOR) gate, an EXCLUSIVE-NOR gate, and a register. The Costas loop further includes a voltage-controlled oscillator (VCO), an in-phase-mixer, a quadrature-phase mixer, an in-phase-matched filter, a quadrature-phase-matched filter, a fixed gain (FG) circuit, and a loop filter. As is well known in the art, the voltage-controlled oscillator, in response to changes in an applied voltage or current from the loop filter, changes a frequency of a VCO-output signal. The voltage-controlled oscillator controls the frequency in response to the voltage or current applied at the input of the voltage-controlled oscillator.

The in-phase mixer generates an in-phase-baseband signal from a received spread-spectrum signal; the quadrature-phase mixer generates a quadrature-phase-baseband signal from the received spread-spectrum signal. The in-phase-matched filter removes a chipping sequence from the in-phase-baseband signal, thereby generating an in-phase-detected signal. The quadrature-phase-matched filter removes the chipping sequence from the quadrature-phase-baseband signal, thereby generating a quadrature-phase-detected signal.

The in-phase limiter generates an in-phase-sign signal from the in-phase-detected signal. The quadrature-phase limiter generates a quadrature-phase-sign signal from the quadrature-phase-detected signal.

The EXCLUSIVE-OR gate exclusively-ors the in-phase-sign signal with the quadrature-phase-sign signal. When the in-phase-sign signal and the quadrature-phase-sign signal have the same signs, then the EXCLUSIVE-OR gate outputs a first error signal. When the in-phase-sign signal and the quadrature-phase-sign signal have different signs, then the EXCLUSIVE-OR gate outputs a second error signal. The fixed-gain circuit, in response to the first error signal, increases the first error signal which in turn changes the frequency of the VCO-output signal after being filtered by the loop filter. When the second error signal is present, the fixed-gain circuit decreases the second error signal which in turn changes the frequency of the VCO-output signal after being filtered by the loop filter.

The EXCLUSIVE-NOR gate compares a present value and a previous value from the first EXCLUSIVE-OR gate. Thus, a signal having a previous value representing a prior output of the EXCLUSIVE-OR gate is stored in a register. The present value is the current output of the EXCLUSIVE-OR gate. When the present value and the previous value are the same, then an XNOR-output signal from the EXCLUSIVE-NOR (XNOR) gate causes an increase in the gain of the AGC circuit. When the two signals are different, then the XNOR-output signal from the EXCLUSIVE-NOR gate causes a decrease in the gain of the AGC circuit.

The present invention also includes a method for improving the performance of a Costas loop. The method includes the steps of generating an in-phase-sign signal from the in-phase-detected signal and generating a quadrature-phase-sign signal from the quadrature-phase-detected signal. A first error signal is generated in response to the in-phase-sign signal and the quadrature-phase-sign signal having the same sign. A second error signal is generated in response to the in-phase-sign signal and the quadrature-phase-sign signal having different signs.

The AGC gain of the AGC circuit increases when two consecutive first error signals or two consecutive second error signals are present and decreases when two consecutive error signals are either a first error signal followed by a second error signal or a second error signal followed by a first error signal. The frequency of the voltage-controlled oscillator changes, depending on fluctuations in the voltage or current level of the AGC signal filtered by the loop filter responsive to the error signals.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
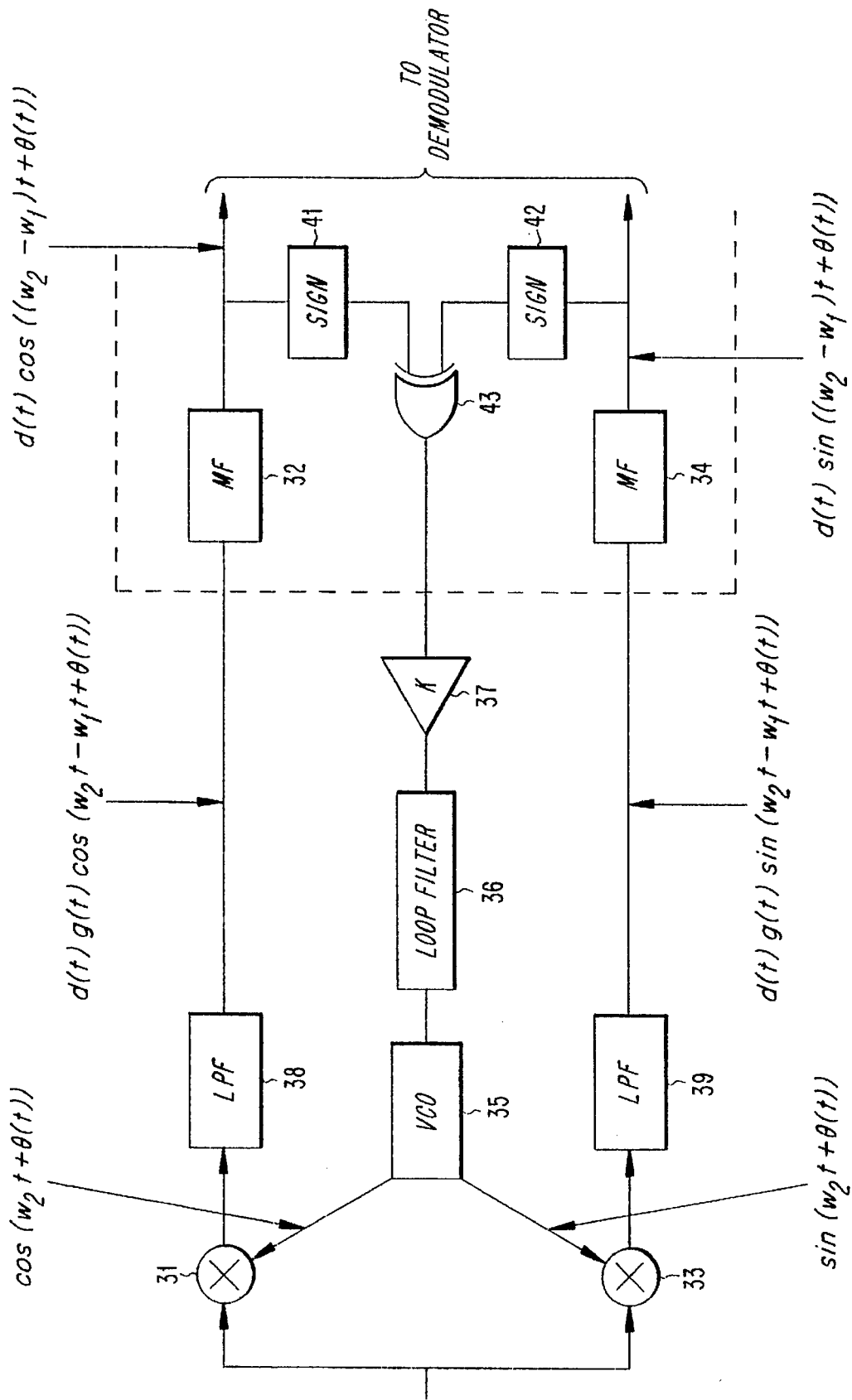
FIG. 1 is a block diagram of a fast-acting Costas loop according to the present invention.

Reference now is made in detail to the present preferred embodiments of the invention, examples of which are illustrated in the accompanying drawings, wherein like reference numerals indicate like elements throughout the several views.

The present invention broadly provides an improvement to a Costas loop. The Costas loop is well known in the art and, as shown in FIG. 1, includes a voltage-controlled oscillator (VCO) 35, a fixed gain circuit 37, an in-phase mixer 31, a quadrature-phase mixer 33, an in-phase-matched filter 32, a quadrature-phase-matched filter 34, and other circuitry such as loop filter 36, which typically is a lowpass filter. The voltage-controlled oscillator 35 is coupled through the loop filter 36 to the fixed gain circuit 37. The output of the voltage-controlled oscillator 35 is coupled to the in-phase mixer 31 and the quadrature-phase mixer 33. The in-phase mixer 31 is coupled through a lowpass filter 38 to the in-phase-matched filter 32, and the quadrature-phase mixer 33 is coupled through a lowpass filter 39 to the quadrature-phase-matched filter 34.

The Costas loop uses the in-phase mixer 31 to generate an in-phase-baseband signal by mixing a received spread-spectrum signal with cos $\omega_o t$ from the voltage-controlled oscillator, and a quadrature-phase mixer 33 to generate a quadrature-phase-baseband signal by mixing the received spread-spectrum signal with sin $\omega_o t$ from the voltage-controlled oscillator. The in-phase-matched filter 32 removes a chipping sequence from the in-phase-baseband signal, thereby generating an in-phase-detected signal. The quadrature-phased-matched filter 34 removes the chipping sequence from the quadrature-phase-baseband signal, thereby generating a quadrature-phase-detected signal.

The improvement to the Costas loop includes first generating means, second generating means, and third generating means. The first generating means is operatively coupled to the in-phase-matched filter 32 and the second generating means is operatively coupled to the quadrature-phase-matched filter 34. The third generating means is operatively coupled to the first generating means and to the second generating means.

The first generating means generates an in-phase-sign signal from the in-phase-detected signal. The second generating means generates a quadrature-phase-sign signal from the quadrature-phase-detected signal. The third generating means, in response to the in-phase-sign signal and the quadrature-phase-sign signal having the same sign, outputs a first error signal. In response to the in-phase-sign signal and the quadrature-phase-sign signal having different signs, the third generating means outputs a second error signal. The terms in-phase-sign signal and quadrature-phase-sign signal, as used herein, represent signals which indicate the sign, i.e., polarity, of the in-phase-detected signal and the quadrature-phase-detected signal, respectively.

The fixed gain circuit 37 is operatively coupled to the third generating means. In response to the first error signal, the fixed-gain circuit 37 increases the first error signal. As a consequence, the increased first error signal at the output of the fixed-gain circuit 37, can change the frequency of the voltage-controlled oscillator 35. In response to the second error signal, the fixed-gain circuit 37 decreases the second error signal. As a result, this changes the frequency of the voltage-controlled oscillator 35. The circuits can be equivalently designed such that either an increase or a decrease in the voltage or current level causes either an increase or a decrease in the frequency of the voltage-controlled oscillator.

In the exemplary arrangement shown in FIG. 1, the first generating means is embodied as an in-phase limiter 41, the second generating means is embodied as a quadrature-phase limiter 42, and the third generating means is embodied as an EXCLUSIVE-OR gate 43. The EXCLUSIVE-OR gate 43 is operatively coupled to the in-phase limiter 41 and to the quadrature-phase limiter 42. Each of the first generating means and the second generating means, by way of example, is shown as a limiter, and may be either a hard limiter, a soft limiter or other device which can determine a sign of the in-phase-detected signal or the quadrature-phase-detected signal, respectively. The third generating means is illustratively shown as an EXCLUSIVE-OR gate. The third generating means alternatively may be embodied from EXCLUSIVE-NOR gates, AND gates, OR gates, and combinations of other logic gates, as is well known in the art. See Schilling, DIGITAL INTEGRATED ELECTRONICS (1977).

The EXCLUSIVE-OR gate 43 is operatively coupled to the in-phase limiter 41 and the quadrature-phase limiter 42. The first EXCLUSIVE-OR gate 43 exclusively-ors the in-phase-sign signal with the quadrature-phase-sign signal. Thus, the EXCLUSIVE-OR gate 43 essentially multiplies the sign signals together to determine as an output whether there is agreement between the signs or disagreement. More particularly, in response to the in-phase-sign signal and the quadrature-phase-sign signal having the same signs, the EXCLUSIVE-OR gate 43 outputs a first error signal. The first error signal, as used herein, indicates that the signs of the in-phase-sign signal and the quadrature-phase-sign signal are the same.

When the in-phase-sign signal and the quadrature-phase-sign signal have different signs, then the EXCLUSIVE-OR gate 43 outputs a second error signal. The second error signal, as used herein, indicates that the in-phase-sign signal and the quadrature-phase-sign signal have different signs.

The fixed gain circuit 37 is operatively coupled to the EXCLUSIVE-OR gate 43. When the first error signal is present at the output of the EXCLUSIVE-OR gate 43 and at the input of the fixed-gain circuit 37, then the fixed-gain circuit 37 increases the first error signal. This, as a consequence, changes the frequency of the voltage-controlled oscillator 35, since the fixed-gain circuit output signal is applied at the input of the voltage-controlled oscillator 35 after being filtered by the loop filter 36. When the second error signal is present at the output of the EXCLUSIVE-OR gate 43, the fixed-gain circuit 37 decreases the second error signal. This, as a consequence, can also change the frequency of the voltage-controlled oscillator 35, albeit in a different direction.

Figure 2:
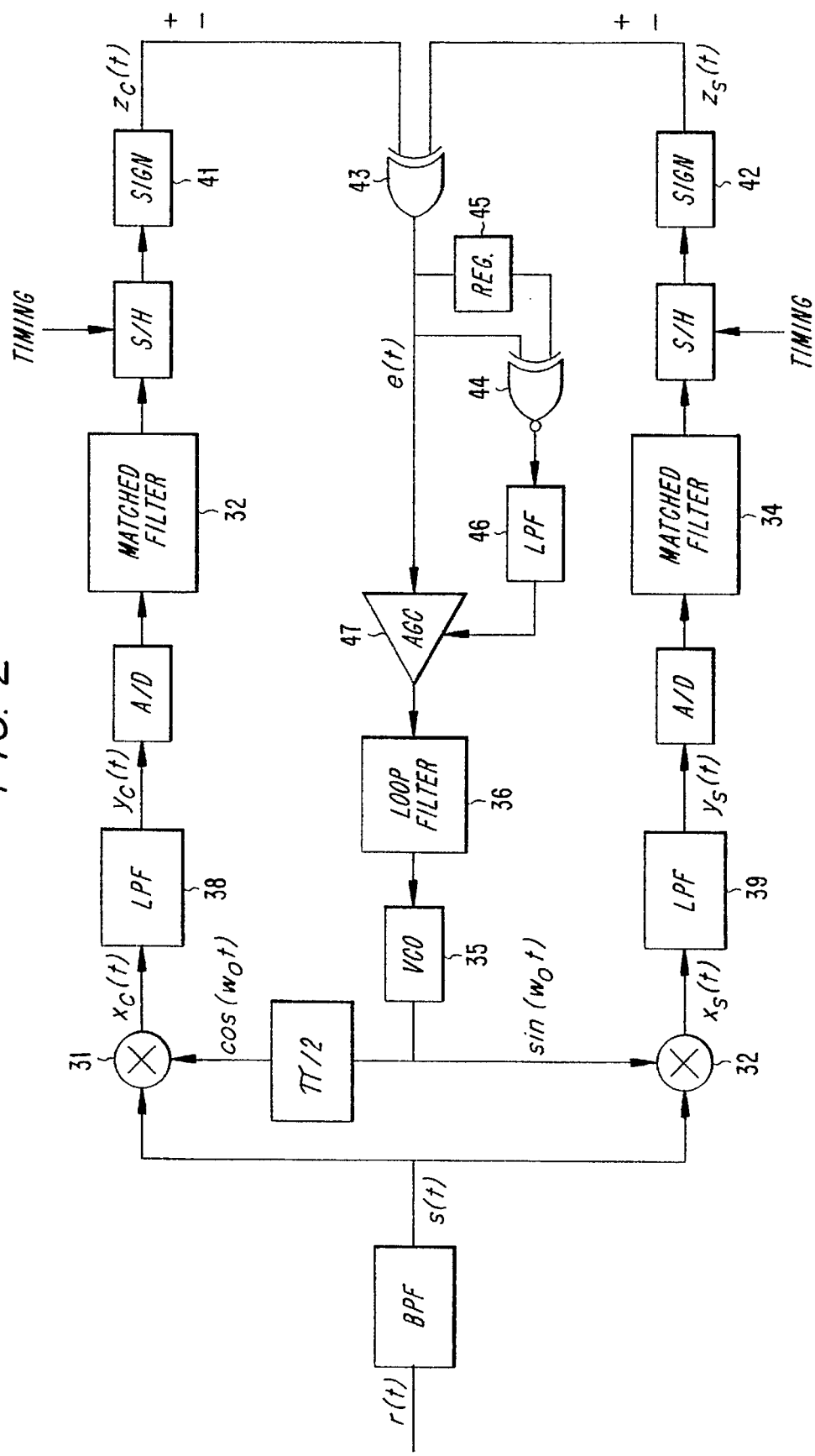
FIG. 2 is a block diagram of a fast-acting Costas loop with a register and an automatic gain control circuit.

As shown in FIG. 2, the present invention also may include an EXCLUSIVE-NOR gate 44, a register 45, and a low pass filter 46. The EXCLUSIVE-NOR gate 44 has a first input operatively coupled to an output of the EXCLUSIVE-OR gate 43, and a second input operatively coupled to the output of the register 45. The register 45 has an input operatively coupled to the output of the EXCLUSIVE-OR gate 43.

The EXCLUSIVE-NOR gate 44 can be used to change the AGC gain, that is, how much the AGC circuit 47 changes the first and second error signals when applied to its input. Thus, the register 45 stores the previous value outputted from the EXCLUSIVE-OR gate 43. The EXCLUSIVE-NOR gate 44 compares the output of the EXCLUSIVE-OR gate 43 and the previous value outputted from the EXCLUSIVE-OR gate 43, which was stored in the register 45. When the output of the EXCLUSIVE-OR gate 43 and the signal stored in the register 45 as the previous value have the same value, then the output of the EXCLUSIVE-NOR gate 44 is a first rate signal indicating to increase the gain of the AGC circuit 47. When the output of the EXCLUSIVE-OR gate 43 and the signal stored in the register 45 as the previous value have different values, namely different signs, then the EXCLUSIVE-NOR gate 44 outputs a second rate signal indicating to decrease the gain of the AGC circuit 47.

Additional registers and EXCLUSIVE-NOR gates may be added 5 to the EXCLUSIVE-NOR gate 44, for comparing previous values and determining various slopes and gain changes of the AGC circuit 47, as desired by a particular design. These variations would be obvious to those skilled in art with understanding of the present invention.

In use of the fast-acting Costas loop of the present invention, the input is a BPSK signal, with g(t) being a pseudo random sequence. The values of $\omega_1$ and $\omega_2$ can differ by a large amount. The lowpass filters remove the sum frequency of $\omega_1+\omega_2+\theta(t)$. The matched filters (MF) remove the pseudo noise sequence g(t), leaving the results, d(t)sin $(\omega_2 t+\theta(t))$ and d(t)cos$(\omega_2 t+\theta(t))$, where d(t) is the data modulation sequence. The two sign circuits extract the sign bit, remembering that this is a digital matched filter. Using the sign bit rather than, say, a 4-bit word, saves gates in the application specific integrated circuit (ASIC). The outputs are EXCLUSIVE-OR, which is mathematically equivalent to a multiplication. Thus, in the ASIC the gate count is increased by only one EXCLUSIVE-OR gate circuit in building the Costas loop. The output of the EXCLUSIVE-OR gate is amplified by the fixed gain circuit 37 before being filtered by the loop filter 36. This is often a proportional plus integral but could have any reasonable shape. The design of such filters is well known in the art and not part of the present invention. Rather, the key elements of the present invention are the blocks depicted in FIGS. 1 and 2, previously discussed.

Looking to FIG. 2, the received signal is first band-pass filtered to remove out-of-band noise and then down-converted to its in-phase and quadrature components using the locally estimated carrier frequency $\omega_o$. The resulting signals $x_c(t)$ and $x_s(t)$ are lowpass-filtered to remove second order harmonics resulting in $y_c(t)$ and $y_s(t)$ for the in-phase and quadrature arms, respectively. These two components are then each filtered by a filter matched to the modulating waveform. An A/D converter can be used if the matched filter operation is to be carried out digitally. The outputs of the matched filters are sampled at the peaks at the symbol rate using a sample-and-hold (S/H) circuit. The signs of the S/H outputs are fed to an exclusive-or (XOR) gate to form the error signal e(t). Normally, this error signal is used to drive a voltage-controlled-oscillator (VCO) after being multiplied by a gain factor K and filtered by the loop filter. The gain factor is used to control the rate of convergence and the loop filter to remove the noise terms from the signal e(t).

According to the present invention, both the in-phase and the quadrature-phase outputs are hard limited and then compared using an XOR gate to form the error signal and using an adaptive gain control subsystem to control the convergence rate of the loop. The adaptive gain control subsystem is comprised of a circuit which compares the current and previous error signals, with the previous error signal delayed by one symbol, and having an output that controls an adaptive gain control (AGC) amplifier after being filtered by a lowpass filter. The comparison circuit output is high when both inputs are the same. The AGC amplifier increases the gain when the controlling input is high and decreases the gain when the controlling input is low. The upper and lower limits of the AGC amplifier, as well as the bandwidth and DC gain of the lowpass filter, are design variables.

Figure 3:
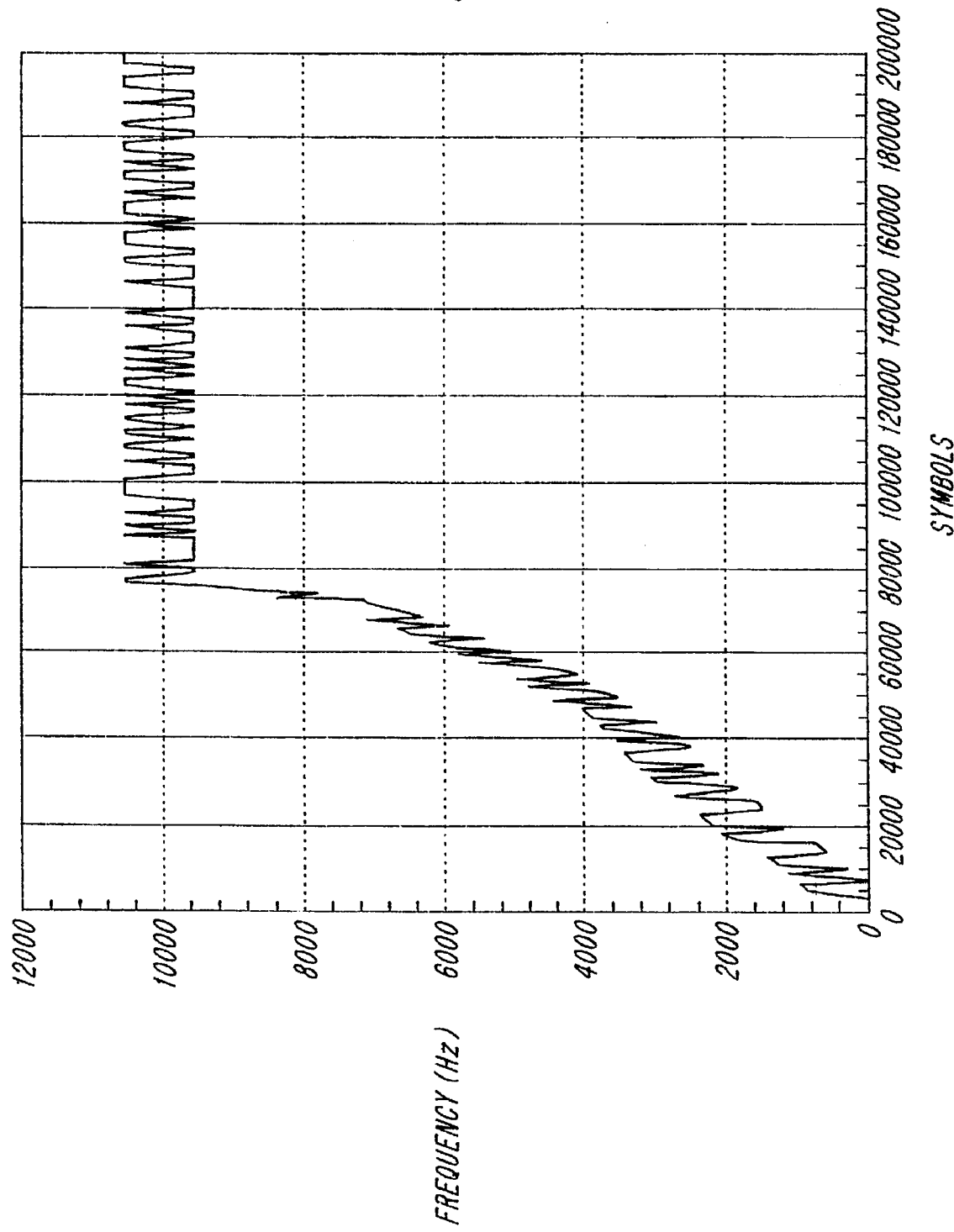
FIG. 3 illustrates frequency offset estimation using a Costas loop without an adaptive gain control.
Figure 4:
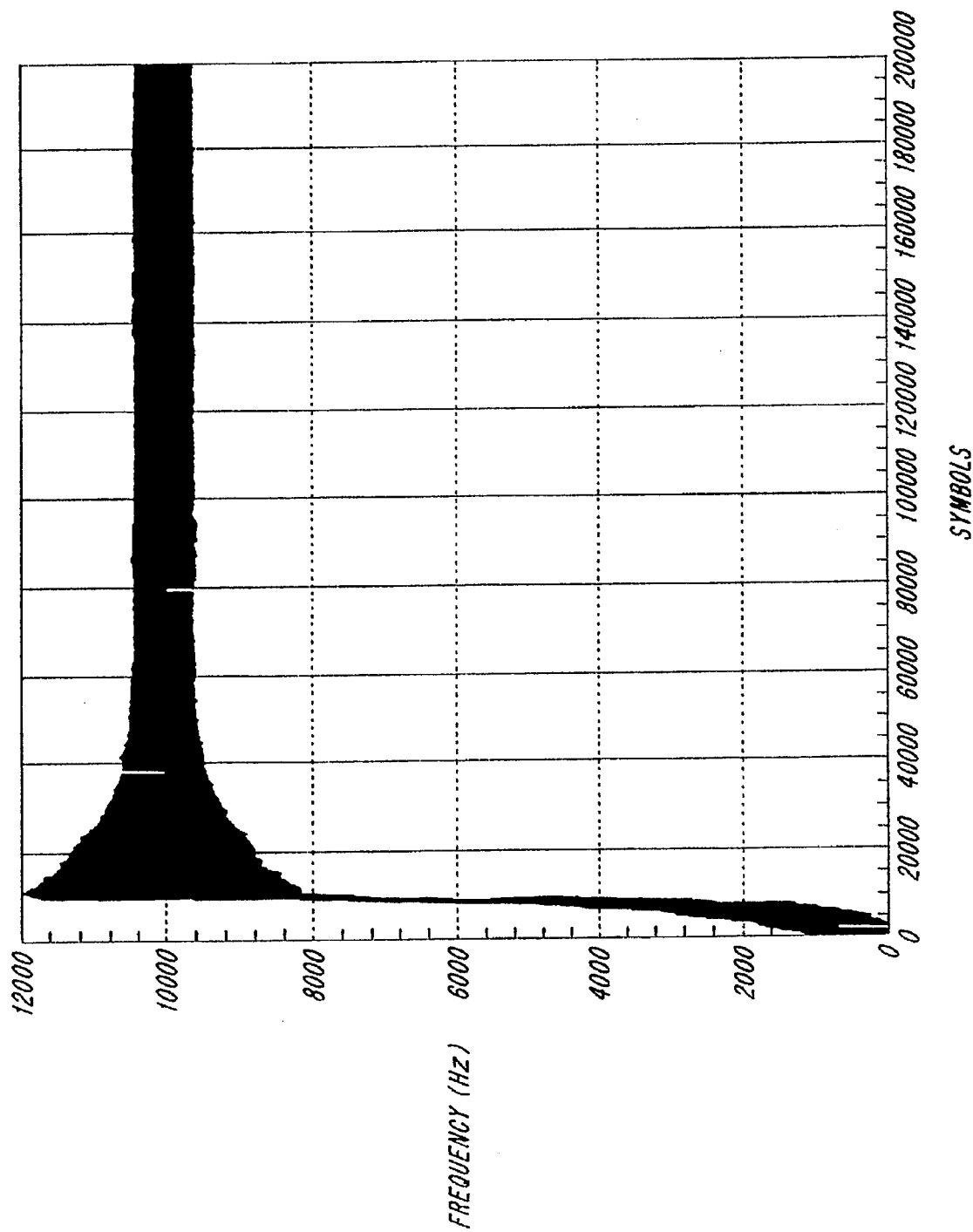
FIG. 4 illustrates frequency offset estimation using a Costas loop with an adaptive gain control.
Figure 5:
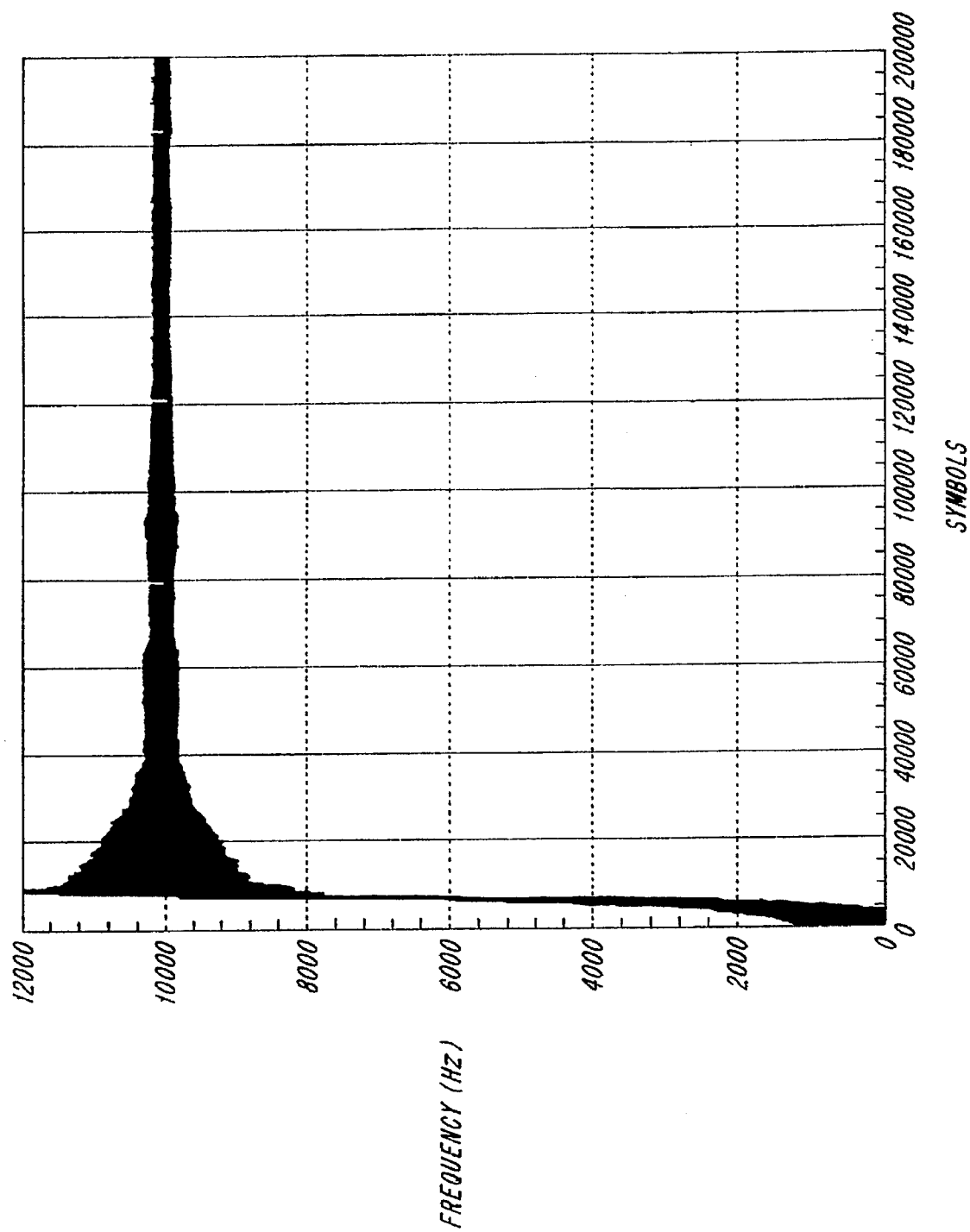
FIG. 5 illustrates frequency offset estimation using a Costas loop with an adaptive gain control, using the same system parameters as those in FIG. 4, with the minimum loop gain reduced.
Figure 6:
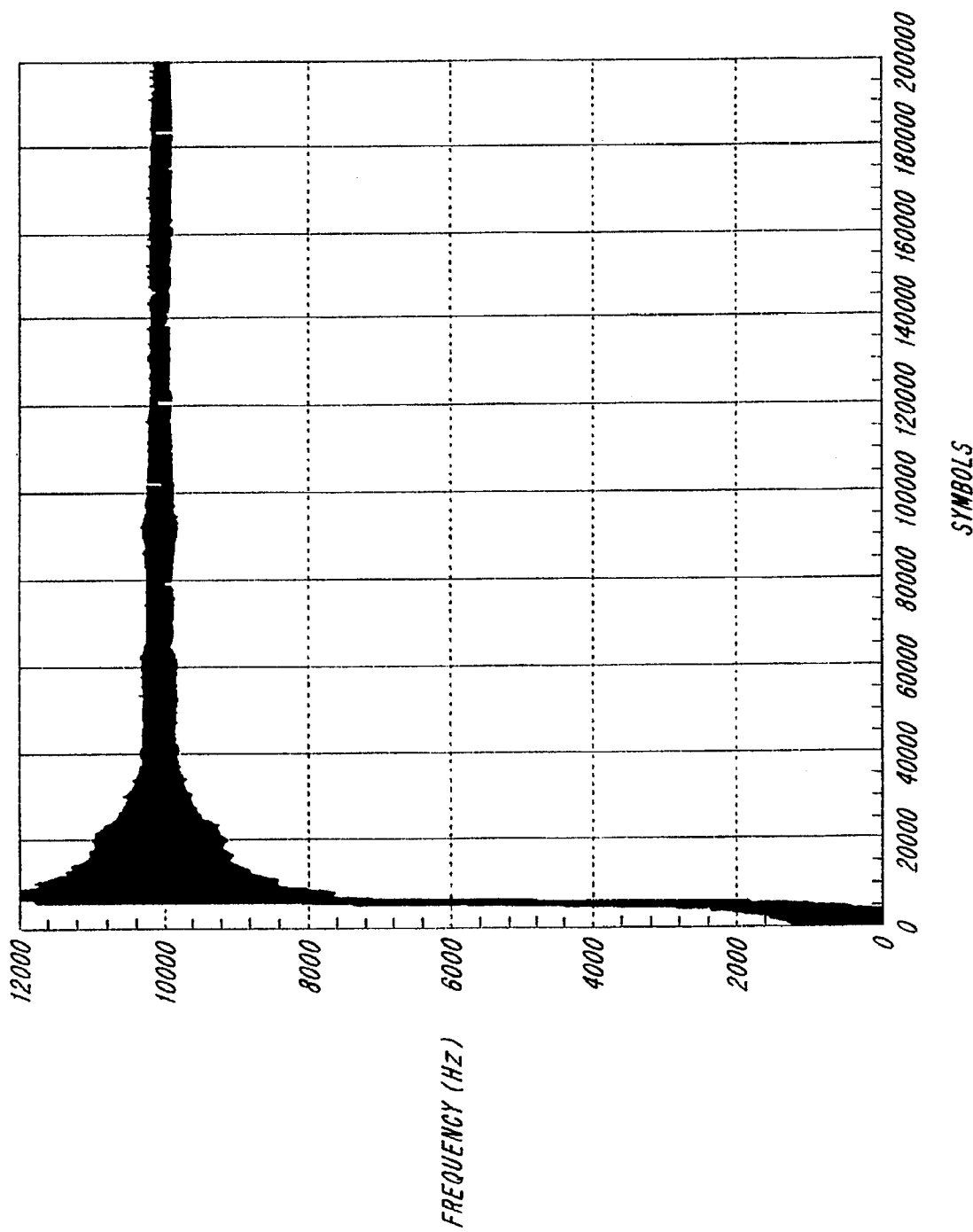
FIG. 6 illustrates frequency offset estimation using a Costas loop with an adaptive gain control, with the same system parameters as those of FIG. 4, with the maximum and the minimum loop gains increased and decreased, respectively.

The overall fast acting Costas loop has been simulated and its performance compared to a Costas loop with the adaptive gain control removed. FIG. 3 shows the locally estimated frequency offset using the Costas loop of FIG. 1 with a fixed gain and a given set of system parameters. Using the same system parameters, the adaptive gain control 47 of FIG. 2 was inserted with a particular minimum gain, maximum gain, and amount of filtering. The resulting frequency offset estimate is shown in FIG. 4. Since the minimum loop gain controls the frequency offset estimation error by increasing the filtering of e(t), and the maximum loop gain controls the convergence rate, two additional graphs were constructed showing this effect. In FIG. 5, the minimum gain was reduced with all other system parameters set to those of FIG. 4. The decrease of the frequency estimation error is evident. In FIG. 6, the parameters of FIG. 5 were used with the maximum gain increased. However, the convergence rate did not increase substantially, while the transients were somewhat increased. Further refinement of the algorithm should eliminate the transient effects and further reduce the steady-state frequency offset estimation error.

It will be apparent to those skilled in the art that various modifications can be made to the fast-acting Costas loop of the instant invention without departing from the scope or spirit of the invention, and it is intended that the present invention cover modifications and variations of the fast-acting Costas loop provided they come within the scope of the appended claims and their equivalents.

I claim:

1. In a Costas loop having a voltage-controlled oscillator coupled to a gain-control circuit, said voltage-controlled oscillator (VCO) responsive to changes in an input signal for changing a frequency of a VCO-output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the improvement comprising:

an in-phase limiter, operatively coupled to said in-phase-matched filter, for generating an in-phase-sign signal from the in-phase-detected signal, with the in-phase-sign signal representing a polarity of the in-phase-detected signal;

a quadrature-phase limiter, operatively coupled to said quadrature-phase-matched filter, for generating a quadrature-phase-sign signal from the quadrature-phase-detected signal, with the quadrature-phase-sign signal representing a polarity of the quadrature-phase-detected signal;

an EXCLUSIVE-OR gate, operatively coupled to said in-phase limiter and to said quadrature-phase limiter, for exclusive-ORing the in-phase-sign signal with the quadrature-phase-sign signal and, responsive to the in-phase-sign signal and the quadrature-phase-sign signal having same signs, for outputting a first error signal, and, responsive to the in-phase-sign signal and the quadrature-phase-sign signal having different signs, for outputting a second error signal;

a fixed-gain-amplifying circuit, operatively coupled to said EXCLUSIVE-OR gate, responsive to the first error signal by increasing the first error signal and, responsive to the second error signal by decreasing the second error signal;

a register, operatively coupled to an output of said EXCLUSIVE-OR gate, for storing any of the first error signal and the second error signal from said EXCLUSIVE-OR gate; and an EXCLUSIVE-NOR gate, having a first input operatively coupled to an output of said EXCLUSIVE-OR gate, a second input operatively coupled to an output of said register, and an output coupled to said fixed-gain-amplifying circuit, responsive to any of the first error signal and the second error signal from said EXCLUSIVE-OR gate, and any of a previous first error signal and a previous second error signal stored in said register having a same value as any of the first error signal and the second error signal from said EXCLUSIVE-OR gate, for increasing the gain in said fixed-gain-amplifying circuit, and responsive to any of the first error signal and the second error signal from said EXCLUSIVE-OR gate and any of a previous first error signal and a previous second error signal stored in said register having a different value, for decreasing the gain in said fixed-gain-amplifying circuit.

2. In a Costas loop having a voltage-controlled oscillator coupled to a gain-control circuit, said voltage-controlled oscillator (VCO) responsive to changes in an input signal for changing a frequency of a VCO-output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the improvement comprising:

first generating means, coupled to said in-phase-matched filter, for generating an in-phase-sign signal from the in-phase-detected signal;

second generating means, coupled to said quadrature-phase-matched filter, for generating a quadrature-phase-sign signal from the quadrature-phase-detected signal;

third generating means, operatively coupled to said first generating means and to said second generating means, responsive to the in-phase-sign signal and to the quadrature-phase-sign signal having same signs for outputting a first error signal, and responsive to the in-phase-sign signal and to the quadrature-phase-sign signal having different signs, for outputting a second error signal;

a fixed gain circuit, operatively coupled to said third generating means, responsive to the first error signal by increasing the first error signal, and responsive to the second error signal by decreasing the second error signal;

a register, operatively coupled to an output of said third generating means, for storing any of the first error signal and the second error signal from said third generating means; and an EXCLUSIVE-NOR gate, having a first input operatively coupled to an output of said third generating means, a second input operatively coupled to an output of said register, and an output coupled to said fixed gain circuit, responsive to any of the first error signal and the second error signal from said third generating means, and any of a previous first error signal and a previous second error signal stored in said register having a same value as any of the first error signal and the second error signal from said third generating means, for increasing the gain of said fixed gain circuit, and responsive to any of the first error signal and the second error signal from said third generating means and any of a previous first error signal and a previous second error signal stored in said register having a different value, for decreasing the gain in said fixed gain circuit.

3. A method using a Costas loop having a voltage-controlled oscillator coupled to a gain-control circuit, said voltage-controlled oscillator responsive to changes in an input signal for changing a frequency of an output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the method comprising the steps of:

generating an in-phase-sign signal from the in-phase-detected signal;

generating a quadrature-phase-sign signal from the quadrature-phase-detected signal;

generating a first error signal in response to the in-phase-sign signal and the quadrature-phase-sign signal having same signs;

generating a second error signal in response to the in-phase-sign signal and the quadrature-phase-sign signal having different signs;

storing any of the first error signal and the second error signal;

comparing any of a first error signal and a second error signal to any of a stored first error signal and a stored second error signal, respectively;

increasing a gain in response to any of a first error signal and a stored first error signal having a same value, and a second error signal and a stored second error signal having a same value, thereby increasing the input signal; and decreasing the gain in response to any of a first error signal and a stored first error having a different value and a second error signal and a stored second error signal having a different value, thereby decreasing the input signal.

4. In a Costas loop having a voltage-controlled oscillator coupled to a gain-control circuit, said voltage-controlled oscillator (VCO) responsive to changes in an input signal for changing a frequency of a VCO-output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the improvement comprising:

an in-phase limiter, operatively coupled to said in-phase-matched filter, for generating an in-phase-sign signal from the in-phase-detected signal, with the in-phase-sign signal representing a polarity of the in-phase-detected signal;

a quadrature-phase limiter, operatively coupled to said quadrature-phase-matched filter, for generating a quadrature-phase-sign signal from the quadrature-phase-detected signal, with the quadrature-phase-sign signal representing a polarity of the quadrature-phase-detected signal;

an EXCLUSIVE-OR gate, operatively coupled to said in-phase limiter and to said quadrature-phase limiter, for exclusive-ORing the in-phase-sign signal with the quadrature-phase-sign signal and, responsive to the in-phase-sign signal and the quadrature-phase-sign signal having same signs, for outputting a first error signal, and, responsive to the in-phase-sign signal and the quadrature-phase-sign signal having different signs, for outputting a second error signal;

an automatic-gain-control (AGC) circuit, operatively coupled to said EXCLUSIVE-OR gate, responsive to the first error signal by increasing the first error signal, responsive to the second error signal by decreasing the second error signal;

a register, operatively coupled to an output of said first EXCLUSIVE-OR gate, for storing any of the first error signal and the second error signal from said EXCLUSIVE-OR gate; and an EXCLUSIVE-NOR gate, having a first input operatively coupled to an output of said EXCLUSIVE-OR gate, a second input operatively coupled to an output of said register, and an output coupled to said AGC circuit, responsive to any of the first error signal and the second error signal from said EXCLUSIVE-OR gate, and any of a previous first error signal and a previous second error signal stored in said register having a same value as any of the first error signal and the second error signal from said EXCLUSIVE-OR gate, for increasing the gain in said AGC circuit, and responsive to any of the first error signal and the second error signal from said EXCLUSIVE-OR gate and any of a previous first error signal and a previous second error signal stored in said register having a different value, for decreasing the gain in said AGC circuit.

5. In a Costas loop having a voltage-controlled oscillator coupled to a gain-control circuit, said voltage-controlled oscillator (VCO) responsive to changes in an input signal for changing a frequency of a VCO-output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the improvement comprising:

first generating means, coupled to said in-phase-matched filter, for generating an in-phase-sign signal from the in-phase-detected signal;

second generating means, coupled to said quadrature-phase-matched filter, for generating a quadrature-phase-sign signal from the quadrature-phase-detected signal;

third generating means, operatively coupled to said first generating means and to said second generating means, responsive to the in-phase-sign signal and to the quadrature-phase-sign signal having same signs for outputting a first error signal, and responsive to the in-phase-sign signal and to the quadrature-phase-sign signal having different signs, for outputting a second error signal;

a register, operatively coupled to an output of said third generating means, for storing any of the first error signal and the second error signal from said third generating means; and an EXCLUSIVE-NOR gate, having a first input operatively coupled to an output of said third generating means, a second input operatively coupled to an output of said register, and an output coupled to said gain-control circuit, responsive to any of the first error signal and the second error signal from said third generating means, and any of a previous first error signal and a previous second error signal stored in said register having a same value as any of the first error signal and the second error signal from said third generating means, for increasing the gain of said gain-control circuit, and responsive to any of the first error signal and the second error signal from said third generating means and any of a previous first error signal and a previous second error signal stored in said register having a different value, for decreasing the gain in said gain-control circuit.

6. A method using a Costas loop having a voltage-controlled oscillator coupled to an automatic-gain-control (AGC) circuit said voltage-controlled oscillator responsive to changes in an AGC signal for changing a frequency of an output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the method comprising the steps of:

generating an in-phase-sign signal from the in-phase-detected signal;

generating a quadrature-phase-sign signal from the quadrature-phase-detected signal;

generating a first error signal in response to the in-phase-sign signal and the quadrature-phase-sign signal having same signs;

generating a second error signal in response to the in-phase-sign signal and the quadrature-phase-sign signal having different signs;

comparing the first error signal to a previously stored value of a first error signal;

increasing an AGC gain in response to the first error signal and the previously stored value of a first error signal having a same value, thereby increasing the AGC signal; and decreasing the AGC gain in response to the first error signal and the previously stored value of a first error signal having a different value, thereby decreasing the AGC signal.

7. A method using a Costas loop having a voltage-controlled oscillator coupled to an automatic-gain-control (AGC) circuit said voltage-controlled oscillator responsive to changes in an AGC signal for changing a frequency of an output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the method comprising the steps of:

generating an in-phase-sign signal from the in-phase-detected signal;

generating a quadrature-phase-sign signal from the quadrature-phase-detected signal;

generating a first error signal in response to the phase-sign signal and the quadrature-phase-sign signal having same signs;

generating a second error signal in response to the in-phase-sign signal and the quadrature-phase-sign signal having different signs;

comparing the second error signal to a previously stored value of a second error signal;

increasing an AGC gain in response to the second error signal and the previously stored value of a second error signal having a same value, thereby increasing the AGC signal; and decreasing the AGC gain in response to the second error signal and the previously stored value of a second error signal having a different value, thereby decreasing the AGC signal.

8. In a Costas loop having a voltage-controlled oscillator coupled to a gain-control circuit, said voltage-controlled oscillator (VCO) responsive to changes in an input signal for changing a frequency of a VCO-output signal from said voltage-controlled oscillator, an in-phase mixer coupled to an input for generating an in-phase-baseband signal from a received-spread-spectrum signal at the input, a quadrature-phase mixer coupled to the input for generating a quadrature-phase-baseband signal from the received-spread-spectrum signal at the input, an in-phase-matched filter coupled to said in-phase mixer for removing a chipping sequence from the in-phase-baseband signal, thereby generating an in-phase-detected signal, a quadrature-phase-matched filter coupled to said quadrature-phase mixer for removing the chipping sequence from the quadrature-phase-baseband signal, thereby generating a quadrature-phase-detected signal, the improvement comprising:

an in-phase limiter, operatively coupled to said in-phase-matched filter, for generating an in-phase-sign signal from the in-phase-detected signal, with the in-phase-sign signal representing a polarity of the in-phase-detected signal;

a quadrature-phase limiter, operatively coupled to said quadrature-phase-matched filter, for generating a quadrature-phase-sign signal from the quadrature-phase-detected signal, with the quadrature-phase-sign signal representing a polarity of the quadrature-phase-detected signal;

an EXCLUSIVE-OR gate, operatively coupled to said in-phase limiter and to said quadrature-phase limiter, for exclusive-ORing the in-phase-sign signal with the quadrature-phase-sign signal and, responsive to the in-phase-sign signal and the quadrature-phase-sign signal having same signs, for outputting a first error signal, and, responsive to the in-phase-sign signal and the quadrature-phase-sign signal having different signs, for outputting a second error signal;

an automatic-gain-control (AGC) circuit, operatively coupled to said EXCLUSIVE-OR gate, responsive to the first error signal by increasing the first error signal, responsive to the second error signal by decreasing the second error signal;

a register, operatively coupled to an output of said EXCLUSIVE-OR gate, for storing any of the first error signal and the second error signal from said EXCLUSIVE-OR gate; and an EXCLUSIVE-NOR gate, having a first input operatively coupled to an output of said EXCLUSIVE-OR gate, a second input operatively coupled to an output of said register, and an output coupled to said AGC circuit, responsive to the first error signal from said EXCLUSIVE-OR gate and a previous first error signal stored in said register having a same value, for outputting a first rate signal indicating to increase the gain in said AGC circuit, and responsive to the first error signal from said EXCLUSIVE-OR gate and the previous first error signal stored in said register having a different value, for outputting a second rate signal indicating to decrease the gain in said AGC circuit, said EXCLUSIVE-NOR gate thereby controlling how much said AGC circuit changes the first error signal received from said EXCLUSIVE-OR gate.

9. The improvement to a Costas loop as set forth in claim 8, said EXCLUSIVE-NOR gate, responsive to the second error signal from said EXCLUSIVE-OR gate and a previous second error signal stored in said register having a same value, for outputting the first rate signal indicating to increase the gain in said AGC circuit, and responsive to the second error signal from said EXCLUSIVE-OR gate and the previous second error signal stored in said register having a different value, for outputting the second rate signal indicating to decrease the gain in said AGC circuit, said EXCLUSIVE-NOR gate thereby controlling how much said AGC circuit changes the second error signal received from said EXCLUSIVE-OR gate.

10. An adaptive gain control subsystem, for use with a Costas loop, comprising:

an in-phase limiter for generating an in-phase-sign signal from an in-phase portion of a despread spread-spectrum signal;

a quadrature-phase limiter for generating a quadrature-phase-sign signal from a quadrature-phase portion of the despread spread-spectrum signal;

an EXCLUSIVE-OR gate, operatively coupled to said in-phase limiter and to said quadrature-phase limiter, for exclusive-ORing the in-phase-sign signal with the quadrature-phase-sign signal and, responsive to the in-phase-sign signal and the quadrature-phase-sign signal having same signs, for outputting a first error signal and, responsive to the in-phase-sign signal and the quadrature-phase-sign signal having different signs, for outputting a second error signal;

an adaptive-gain-control amplifier, operatively coupled to an output of said EXCLUSIVE-OR gate, responsive to the first error signal for increasing gain and responsive to the second error signal for decreasing gain;

a register, operatively coupled to an output of said EXCLUSIVE-OR gate, for storing any of the first error signal and the second error signal from said EXCLUSIVE-OR gate; and an EXCLUSIVE-NOR gate, having a first input operatively coupled to an output of said EXCLUSIVE-OR gate, a second input operatively coupled to an output of said register, and an output coupled to said adaptive-gain-control amplifier, responsive to any of the first error signal and the second error signal from said EXCLUSIVE-OR gate, and any of a previous first error signal and a previous second error signal stored in said register having a same value as any of the first error signal and the second error signal from said EXCLUSIVE-OR gate, for increasing the gain in said adaptive-gain-control amplifier, and responsive to any of the first error signal and the second error signal from said EXCLUSIVE-OR gate and any of a previous first error signal and a previous second error signal stored in said register having a different value, for decreasing the gain in said adaptive-gain-control amplifier.

* * * * *